United States Patent [19]

Franklin

[11] Patent Number: 4,871,981
[45] Date of Patent: Oct. 3, 1989

[54] FAST HOPPING MICROWAVE FREQUENCY SYNTHESIZER

[75] Inventor: Jeffrey W. Franklin, Largo, Fla.
[73] Assignee: E-Systems, Inc., Dallas, Tex.
[21] Appl. No.: 273,555
[22] Filed: Nov. 21, 1988
[51] Int. Cl.$^4$ .............................................. H03L 7/18
[52] U.S. Cl. ..................................... 331/1 A; 331/16; 331/18; 331/25
[58] Field of Search ..................... 331/1 A, 16, 18, 25, 331/34, 45; 332/19; 455/260

[56] References Cited

U.S. PATENT DOCUMENTS

| | | | |
|---|---|---|---|
| 3,798,550 | 3/1974 | Takaoka | 455/208 |
| 3,979,691 | 9/1976 | Balliet | 331/1 A |
| 3,983,506 | 9/1976 | Rettinger, Jr. et al. | 331/17 |
| 4,072,909 | 2/1978 | Citta | 331/12 |
| 4,262,264 | 4/1981 | Vandegraaf | 331/4 |
| 4,336,505 | 6/1982 | Meyer | 331/1 R |
| 4,409,563 | 10/1983 | Vandegraaf | 331/11 |
| 4,647,874 | 3/1987 | Rittenbach | 331/11 |
| 4,733,197 | 3/1988 | Chow | 331/1 A |

FOREIGN PATENT DOCUMENTS 1424253 10/1973 United Kingdom .

Primary Examiner—David Mis
Attorney, Agent, or Firm—Albert M. Crowder, Jr.

[57] ABSTRACT

A microwave frequency synthesizer which simultaneously provides increased frequency coverage, reduced channel spacings and improved settling times with a single phase-locked-loop. A VCO and a parametric divider enables a wide frequency coverage to be used in a phase-locked-loop. The fast hopping capability is primarily derived from the wide loop bandwidth which, in turns, is permitted by using a high reference frequency. The small channel spacings are created by using a 90° phase shifter installed in the feedback path of the phase-locked-loop. The 90° phase shifter permits channel spacings as small as ¼ the reference frequency value.

18 Claims, 1 Drawing Sheet

FAST HOPPING MICROWAVE FREQUENCY SYNTHESIZER

FIELD OF THE INVENTION

The present invention relates generally to frequency synthesizers and, in particular, to a microwave frequency synthesizer that can simultaneously provide very wide frequency coverage, small channel spacings, and very fast settling times with a single phase-locked-loop.

BACKGROUND OF THE INVENTION

Microwave frequency synthesizers are well known in the prior art and where they use a voltage controlled oscillator (VCO) in a single phase-locked-loop, they utilize a technique known as "fractional-N" or "digiphase" control. The basic technique is to generate small channel spacings by switching between two values of N in the feedback path of the loop where N=a frequency divider value determined by a programmable divider in the loop and connected to receive the output of the VCO. The value of N is altered at the end of every division such that over a long period of time, the average value of N is a fractional value and synthesizer output frequencies, or channels, can be created that are spaced closer together than the reference frequency would otherwise permit.

However, the smallest channel spacings depend upon the smallest change in N that can be permitted. The smallest frequency or channel spacing is limited to a value equal to the reference frequency. Generated channels spaced smaller than the reference frequency required synthesizers that used direct synthesis, multiple-phase-locked loops or a single phase-lock-loop combined with another synthesizer. All of these techniques require more than a single phase-locked-loop combined with another synthesizer.

There are several disadvantages with the prior art microwave frequency synthesizer. The fractional-N synthesizer generates significant noise and incidental frequency modulation (IFM). This noise is usually compensated with correction voltages fed into the phase detector and by narrow phase-locked-loop bandwidths. Since fast settling and narrow loop bandwidths are incompatible, the only method of getting a fractional-N synthesizer to settle quickly and to have minimal IFM is by precisely compensating the error voltage. Limits exist on how precisely this compensation can be done, which, in turns, limits the IFM suppression.

Before the existence of fractional-N synthesizers, the dual requirement of fast settling and small channel spacings could not be performed by a single phase-locked-loop.

The present invention overcomes the disadvantages of the prior art by providing a synthesizer design which permits the generation of small channel spacings without requiring a low reference frequency or a "fractional-N" implementation. This permits the synthesizer to settle quickly without generating excess IFM (from "fractional-N" division) in a single phase-locked-loop.

The wide frequency coverage is achieved by using a voltage controlled oscillator (VCO) and a parametric divider with wide band frequency coverage in a phase-locked-loop. The fast hopping capability or fast settling time, is primarily derived from the wide loop bandwidth which, in turn, is permitted by using a high reference frequency. The small channel spacings are created by using a 90° phase shifter installed in the feedback path of the phase-locked-loop. The 90° phase shifter permits channel spacings as small as ¼ the reference frequency value. One primary advantage of the 90° phase shifter is that the use of fixed prescaling in the phase-locked-loop does not result in the loss of channels as occurs in the prior art.

The present invention uses a voltage controlled oscillator having wide frequency coverage. Its output is coupled to a 90° phase shifter which assists in enabling small channel spacings to exist. The output of the phase shifter is coupled to a fixed parametric divider which enables prescaling to exist in the phase-locked-loop. The output of the fixed divider is coupled to a programmable divider which divides the frequency according to a predetermined schedule or number. The fixed and programmable dividers, in conjunction with the voltage controlled oscillator, enable wide frequency coverage to exist in the feedback loop. The output of the programmable divider is coupled to a phase detector where it is compared with a reference frequency. The reference frequency is relatively high and, in conjunction with the wide loop bandwidth, enables a fast hopping capability or a fast settling time to exist within the single phase-locked-loop. The output of the phase detector is coupled through a loop filter back to the voltage controlled oscillator to form the feedback loop. The output frequency, $f_{out}$, of the VCO is dependent upon the reference frequency, $f_{ref}$, the divider value, N, of the fixed and programmable divider and the number, R, of 90° phase shifts occurring in one period of the reference frequency. Thus, the phase shifter is controlled from a command center such as a memory array having a stored program or a computer which predetermines the values of R and N to enable the synthesizer to operate at a preset or predetermined frequency.

SUMMARY OF THE INVENTION

Thus, the invention relates to a fast hopping frequency synthesizer having a voltage controlled oscillator for generating an output frequency, a phase shifter coupled to receive the voltage controlled oscillator output frequency and shift the output frequency 90° to cause small channel spacings, a frequency divider coupled to receive the output of the 90° phase shifter to reduce the frequency of the 90° phase shifted frequency to provide wide frequency coverage, a reference frequency, a phase detector for comparing the reference frequency with the frequency output of the frequency divider and generating a control signal and means coupling the control signal to the voltage controlled oscillator to form a frequency synthesizer with wideband frequency coverage and a single phase-locked-loop.

The invention also relates to a method for improving a microwave frequency synthesizer to provide increased frequency coverage, reduced channel spacings and improved settling times comprising the steps of generating an output frequency with a voltage controlled oscillator, coupling a phase shifter to the voltage controlled oscillator for shifting the output frequency 90° to cause reduced channel spacings, coupling a frequency divider to the output of the 90° phase shifter for reducing the frequency of the 90° phase shifted frequency to provide increased frequency coverage, providing a reference frequency, comparing the reference frequency with the output frequency of the frequency divider with a phase detector to generate a control signal, and coupling the control signal to the voltage controlled oscillator to form a frequency synthesizer with increased frequency coverage and having a single phase-locked-loop.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE DRAWINGS

Figure 1:
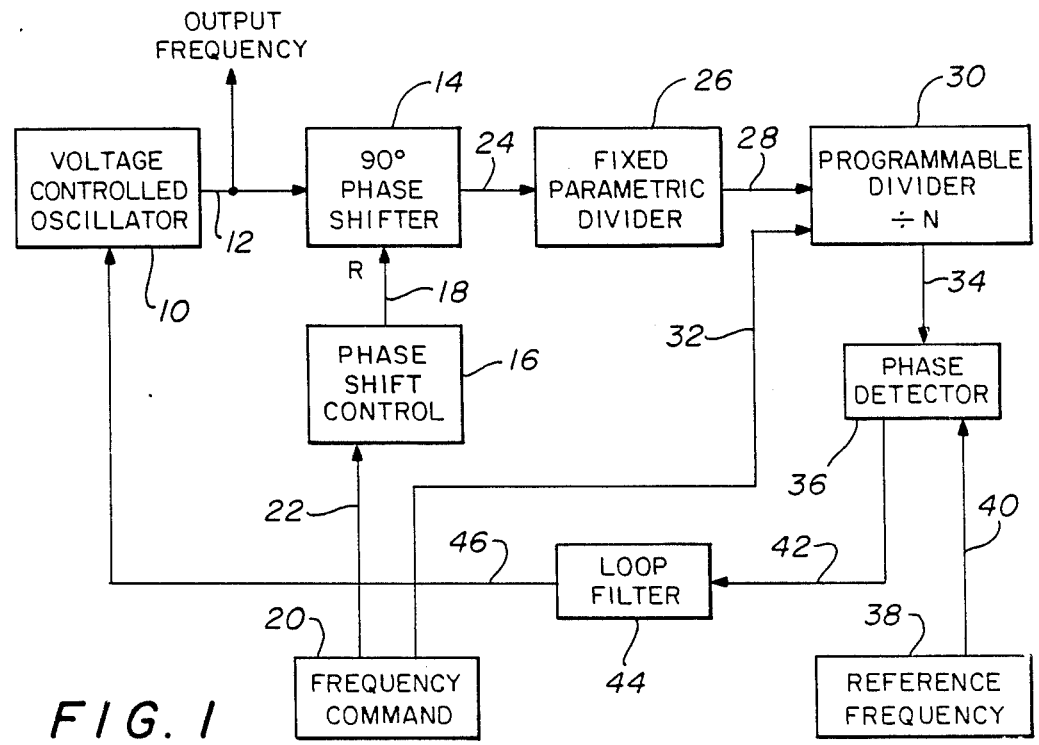
FIG. 1 is a schematic diagram of the novel microwave frequency synthesizer.

As can be seen in FIG. 1, the output of voltage controlled oscillator 10 on line 12 is coupled to a 90° phase shifter 14 in the feedback path of the phase-locked-loop. The 90° phase shifter 14 permits channel spacings as small as ¼ the reference frequency value.

Phase shift control unit 16 generates an output on line 18 which is coupled to the 90° phase shifter 14 and determines the number of 90° phase shifts, R, occurring in one period of the reference frequency. The number of 90° phase shifts desired can be determined by a command device 20 which may be a computer program or a memory array having a stored program. The output of the command unit 20 on line 22 causes the phase shift control unit 16 to generate the necessary outputs on line 18 which bring about the necessary number of 90° phase shifts in unit 14.

The phase shifted output from unit 14 one line 24 is coupled to a fixed parametric divider 26 which allows fixed prescaling to occur in the phase-locked-loop. The output of the fixed parametric divider 26 on line 28 is coupled to a programmable divider 30 which, in conjunction with the fixed divider 26, allows a divider value, N, which is variable and which, in conjunction with the voltage controlled oscillator 10, allows wide frequency coverage. The programmable divider 30 is controlled with a signal on line 32 from the command unit 20 which, as stated previously, may be a computer program or a memory array having a stored program. Thus, by using a predetermined command signal from unit 20 on line 32, the programmable divider 30, in conjunction with the fixed divider 26, provides a variable divider value, N.

A phase detector 36 receives the output of the programmable divider 30 on line 34 and the output, $f_{ref}$, of a reference frequency 38 on line 40 and generates a control signal on line 42 which represents the phase difference between the divided frequency and the reference frequency. The control signal on line 42 is coupled to a loop filter 44 for filtering and which generates an output on line 46 which is coupled back to the voltage controlled oscillator, thus, completing the phase-locked-loop.

The operation of the synthesizer is as follows:

When the loop is in phase lock, the voltage controlled oscillator 10 will output a frequency according to the equation $$(1)\ f_{out}=(f_{ref}\times N)+\tfrac{1}{4}(f_{ref}\times R)$$

where N is the divider value of the fixed and programmable divider and R is the number of 90° phase shifts occurring in one period of the reference frequency. Consider the following example:

Let $f_{ref}$=400 KHz (Period=1/400k=2.5 usec)

N=12,500

R=1 (one 90° phase shift in each reference frequency period)

Then, using equation (1), $$\begin{aligned} f_{out} &= (4\times 10^5)(12{,}500) + 1/4(1)(4\times 10^5) \\ f_{out} &= 5\ \text{GHz} + 100\ \text{KHz} \\ &= 5000.1\ \text{MHz} \end{aligned} \quad (2)$$

Thus, the effect of the programmable divider is illustrated in the first part of equation (2) and the effect of the 90° phase shifter is added in the second part of equation (2). One primary advantage of the 90° phase shifter is that the use of fixed prescaling with parametric divider 26 in the phase-locked-loop does not result in the loss of channels.

In the previous case, for example, if it is assumed that the N of 12,500 consisted of a fixed divide by 10 followed by a programmable divider that can divide by 1,000 to 1,500 in steps of 1, then the next highest N would be:

(3) $N=1251\times 10=12{,}510$

Returning to equation (1), if the equation is calculated with N=12,510, the output of the synthesizer is 5,004 MHz. Thus, without the 90° phase shifter, the smallest channel spacings would be 4 MHz. However, with the 90° phase shifter in the phase-locked-loo, and allowing R to vary from 0 to 40, then 100 KHz channels can be generated from 5,000 to 5,004 MHz. Returning to equation (1), and using N=12,500 and R=2, it can be readily seen that the output of the synthesizer is 5000.2 MHz. If this calculation is repeated with R varying up to the number 40, the synthesizer will output 5,004 MHz. At that point, of course, N can be changed to the next highest number of 12,510 as calculated earlier. Again, allowing R to vary from 0 to 40, 10 KHz channels can be generated from 5,004 MHz to 5,008 MHz.

Thus, it can be seen that where fixed prescaling is used in the phase-locked-loop without a 90° phase shifter, frequency synthesizers lose channels. It can also be seen with the installation of the 90° phase shifter in the phase-locked-loop along with the fixed prescaler and the programmable divider, the synthesizer not only recovers the channels that are lost, as indicated, due to prescaling, but also adds channels that would not exist even if no prescaling was necessary. As stated previously, the basic technique to generate small channel spacings in the prior art is to switch between two values of N in the feedback path of the loop. The value of N is altered at the end of every division such that over a long period of time, the average value of N is a fractional value and synthesizer output frequencies (channels) can be created that are spaced closer together than the reference frequency would otherwise permit. If that technique were not used in the prior art, then the smallest channel spacings would depend on the smallest change in N that could be permitted. Thus, the smallest frequency or channel spacing in the prior art is limited to a value equal to the reference frequency. If channels were generated in the prior art that were spaced smaller than the reference frequency, synthesizers were required that used direct synthesis, multiple phase-locked-loops or a single phase-locked-loop combined with another synthesizer. All of these techniques require more than a synthesizer comprised of a single phase-locked-loop.

Thus, the 90° phase shifter in the phase-locked-loop of the present invention enables small channel spacings or reduced channel spacings as small as ¼ the reference frequency value. This also enables a much higher reference frequency to be used which improves the settling time with a single phase-locked-loop and the settling time is much faster than the synthesizers of the prior art. Finally, the system allows a very broad, increased frequency coverage over the prior art with the use of the VCO and the parametric divider in a phase-locked-loop.

Figure 2:
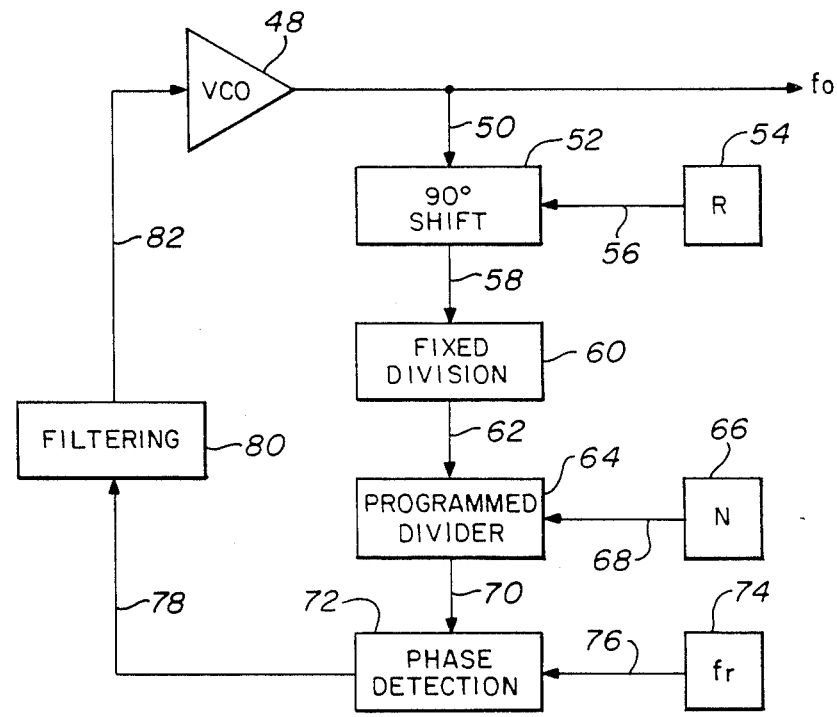
FIG. 2 is a flow chart illustrating the method of synthesizing microwave frequencies over an increased frequency range with reduced frequency spacing and improved settling times with the use of a single phase-locked-loop.

The method of obtaining synthesized frequencies having increased frequency coverage, reduced channel spacings and improved settling times with a single phase-locked-loop is illustrated in the flow chart of FIG. 2. As can be seen in FIG. 2, the output of the voltage controlled oscillator 48 on line 50 is shifted 90° at step 52 with the number of phase shifts occurring in one period of the reference frequency being determined by control values generated at 54 as by a computer program or memory array and coupled on line 56 to cause the desired number of 90° phase shifts per period of the reference frequency. The shifted frequency on line 58 is divided a fixed amount at 60 with the result on line 62 further divided a programmable amount at 64 as determined by generated signals at 66 on line 68. The generated signals at 54 and 66 may be a computer program or memory array in which programmable data has been stored. The phase difference between the divided frequency signal on line 70 and a reference frequency signal 74 and appearing on line 76 is detected at 72. The detected difference on 78 is filtered at 80 and coupled by line 82 back to the voltage controlled oscillator for setting the frequency thereof.

Again, the use of a VCO and parametric divider in a phase-locked-loop with a high reference frequency enables a wide frequency coverage. In addition, the use of the 90° phase shifter in the feedback path of the phase-locked-lop enables small channel spacings to be created as small as ¼ of the reference frequency value. The method enables very fast hopping capabilities and fast settling times because of the ability to use a high reference frequency.

Thus, there has been disclosed a microwave frequency synthesizer that can simultaneously provide increased frequency coverage, reduced channel spacings and improved settling times with a single phase-locked-loop. The wide frequency coverage is achieved by using a voltage controlled oscillator and a parametric divider in a phase-locked-loop. The fast hopping capability is primarily derived from the wide loop bandwidth which, in turn, is permitted by using a high reference frequency. The small channel spacings are created by using a 90° phase shifter installed in the feedback path of the phase-locked-loop. The 90° phase shifter permits channel spacings as small as ¼ the reference frequency value.

While the invention has been described in connection with a preferred embodiment, it is not intended to limit the scope of the invention to the particular form set forth, but, on the contrary, it is intended to cover such alternatives, modifications and equivalents as may be included within the spirit and scope of the invention as defined in the appended claims.

I claim:

1. A fast hopping frequency synthesizer comprising:
   a voltage controlled oscillator for generating an output signal frequency;
   a reference frequency;
   a programmable phase shifter coupled to receive the voltage controlled oscillator output signal frequency for shifting the output frequency a predetermined number of 90° phase shifts in one period of the reference frequency;
   a frequency divider coupled to receive the output of said phase shifter and reduce the frequency of the phase shifted signal;
   a phase detector for comparing the reference frequency with the output of the divided, 90° phase shifted, output frequency and generating a control signal; and
   means for coupling the control signal to the voltage controlled oscillator to form a frequency synthesizer with a single phase-locked-loop.

2. A synthesizer as in claim 1 wherein said frequency divider comprises:
   a fixed frequency divider coupled to said 90° phase shifter for dividing said phase shifted frequency a first fixed amount; and
   a programmable divider for receiving the output from the fixed divider and further dividing the phase shifted frequency a second predetermined, preselected amount.

3. A synthesizer as in claim 2 further comprising:
   means for generating a command signal representing a predetermined divider value necessary to obtain the combined divider value, N, of the fixed and programmable divider; and
   means coupling said command signal representing the predetermined divider value to said programmable divider to cause said 90° phase shifted output to be divided by N to provide increased frequency coverage.

4. A synthesizer as in claim 3 wherein said means for generating a command signal is a memory array having a stored program representing said predetermined divider value.

5. A synthesizer as in claim 1 further comprising:
   a phase shift control circuit coupled to said 90° phase shifter for causing the phase shifts to be generated by said 90° phase shifter; and
   programmable means coupled to said phase shift control circuit for causing said control circuit to establish a predetermined number, R, of 90° phase shifts per each cycle of reference frequency to cause reduced channel spacing.

6. A synthesizer as in claim 5 wherein said means coupled to said phase shift control circuit is a memory array having a stored program containing the predetermined number of 90° phase shifts desired.

7. A synthesizer as in claim 1 wherein said reference frequency is a microwave signal having a frequency sufficiently high that when used with the wide bandwidth of the loop causes an improved settling time.

8. A microwave frequency synthesizer comprising:
   means for generating a reference frequency, $f_r$;
   a voltage controlled oscillator for generating an output frequency, $f_o$;

programmable means coupled to the voltage controlled oscillator for shifting the output frequency, $f_o$, a predetermined number of 90° phase shifts, R, in one period of the reference frequency;

means for dividing the shifted output frequency, $f_o$, by a predetermined number, N;

means for detecting the phase difference between the divided frequency and the reference frequency, $f_r$, to generate a control signal; and means coupling the control signal to the voltage controlled oscillator to cause the output frequency, $f_o$, to vary in accordance with the equation $$f_o = (f_r \times N) + \tfrac{1}{4}(f_r \times R).$$

9. A method of synthesizing a microwave frequency having increased frequency coverage, reduced channel spacings and improved settling times with a single phase-locked-loop comprising the steps of:

generating an output frequency with a voltage controlled oscillator;

generating a reference frequency;

programmably shifting the output frequency a predetermined number of 90° phase shifts in one period of the reference frequency to cause reduced channel spacings;

dividing the 90° phase shifted output frequency to reduce the frequency a predetermined amount;

comparing the reference frequency with the output of the divided, 90° phase shifted, output frequency to detect the phase difference and generate a control signal; and coupling the control signal to the voltage controlled oscillator to form a frequency synthesizer with increased frequency coverage and a single phase-locked-loop.

10. A method as in claim 9 wherein the step of dividing the output of the 90° phase shifter further comprises the steps of:

coupling a fixed frequency divider to the 90° phase shifter for dividing the phase shifted output frequency a first fixed amount; and further dividing the phase shifted frequency from the fixed divider a second predetermined, preselected amount with a programmable divider.

11. A method as in claim 10 further comprising the steps of:

generating a command signal representing a predetermined divider value necessary to obtain the combined divider value, N, of the fixed and programmable divider; and coupling said command signal representing the predetermined divider value to said programmable divider to cause the 90° phase shifted output from the combined fixed divider and the programmable divider to be divided by N to provide increased frequency coverage.

12. A method as in claim 11 wherein the step of generating a command signal further comprises the step of storing a program in a memory array representing said predetermined divider value.

13. A method as in claim 9 further comprising the steps of:

generating output signals with a phase shift control circuit to cause the 90° phase shifts; and causing said control circuit to generate a predetermined number, R, of 90° phase shifts per each cycle of reference frequency to cause reduced channel spacing.

14. A method as in claim 13 wherein the step of establishing the number of output signals generated by the control circuit further comprises the step of storing a program in a memory array containing the predetermined number of 90° phase shifts desired.

15. A method as in claim 9 wherein the step of generating the reference frequency further comprises the step of generating a microwave signal having a frequency sufficiently high that when used with the wide bandwidth of the feedback loop causes an improved settling time.

16. A method of synthesizing a microwave frequency that can simultaneously provide increased frequency coverage, reduced channel spacings and improved settling times with a single phase-locked-loop comprising the steps of:

generating a reference frequency, $f_r$;

generating an output frequency, $f_o$, with a voltage controlled oscillator;

programmably shifting the output frequency, $f_o$, a predetermined number of 90° phase shifts, R, in one period of the reference frequency;

dividing the shifted frequency, $f_o$, by a predetermined number, N;

detecting the phase difference between the divided, 90° phase shifted, output frequency and the reference frequency, $f_r$, to generate a control signal; and coupling the control signal to the voltage controlled oscillator to cause the output frequency, $f_o$, to vary in accordance with the equation $$f_o = (f_r \times N) + \tfrac{1}{4}(f_r \times R).$$

17. A fast hopping frequency synthesizer comprising:

a voltage controlled oscillator for generating an output signal frequency;

a phase detector;

a series coupled frequency divider and programmable phase shifter circuit coupled to and receiving the output signal of said voltage controlled oscillator and generating an output signal to said phase detector, said programmable phase shifter shifting the output frequency of the voltage controlled oscillator a predetermined number of 90° phase shifts in one period of the reference frequency and said frequency divider reducing the frequency of said voltage controlled oscillator by a predetermined amount;

means for generating a reference frequency;

said phase detector comparing the reference frequency with the output signal from the series coupled frequency divider and programmable phase shifter circuit and generating a control signal; and means for coupling the control signal to the voltage controlled oscillator to form a frequency synthesizer with a single phase-locked-loop.

18. A synthesizer as in claim 17 wherein said frequency divider is programmable.

* * * * *